(12) United States Patent
Kuo et al.

(10) Patent No.: US 9,818,727 B2
(45) Date of Patent: Nov. 14, 2017

(54) SEMICONDUCTOR PACKAGE ASSEMBLY WITH PASSIVE DEVICE

(71) Applicant: MediaTek Inc., Hsin-Chu (TW)

(72) Inventors: Che-Hung Kuo, Tainan (TW);
Ying-Chih Chen, Kaohsiung (TW);
Che-Ya Chou, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/012,018

(22) Filed: Feb. 1, 2016

(65) Prior Publication Data

US 2016/0268233 A1 Sep. 15, 2016

Related U.S. Application Data

(60) Provisional application No. 62/135,322, filed on Mar. 19, 2015, provisional application No. 62/130,048, filed on Mar. 9, 2015.

(51) Int. Cl.
*H01L 23/48* (2006.01)
*H01L 25/065* (2006.01)
*H01L 25/16* (2006.01)
*H01L 23/31* (2006.01)
*H01L 23/00* (2006.01)
(Continued)

(52) U.S. Cl.
CPC .......... *H01L 25/0657* (2013.01); *H01L 25/16* (2013.01); *H01L 23/3128* (2013.01); *H01L 24/05* (2013.01); *H01L 24/06* (2013.01); *H01L 24/32* (2013.01); *H01L 24/73* (2013.01); *H01L 25/0652* (2013.01); *H01L 2224/0401* (2013.01); *H01L 2224/04042* (2013.01); *H01L 2224/04105* (2013.01); *H01L 2224/05554* (2013.01); *H01L 2224/06135* (2013.01); *H01L 2224/12105* (2013.01); *H01L 2224/16145* (2013.01); *H01L 2224/16227* (2013.01); *H01L 2224/32225* (2013.01); *H01L 2224/4824* (2013.01); *H01L 2224/48091* (2013.01); *H01L 2224/48145* (2013.01); *H01L 2224/48227* (2013.01);
(Continued)

(58) Field of Classification Search
CPC ... H01L 2224/16225; H01L 2224/3225; H01L 2224/73265; H01L 2224/48091; H01L 2224/48227; H01L 2224/73204; H01L 2224/32145; H01L 23/49816; H01L 23/3128; H01L 23/49827; H01L 23/481; H01L 23/50; H01L 25/0657; H01L 25/50; H01L 2225/06582; H01L 2225/06506
See application file for complete search history.

(56) References Cited

U.S. PATENT DOCUMENTS 5,905,639 A 5/1999 Warren
7,566,584 B2 7/2009 Ito
(Continued)

FOREIGN PATENT DOCUMENTS

CN 1420537 A 5/2003
CN 1649115 A 8/2005
(Continued)

*Primary Examiner* — (Vikki) Hoa B Trinh
(74) *Attorney, Agent, or Firm* — McClure, Qualey & Rodack, LLP

(57) ABSTRACT

The invention provides a semiconductor package assembly. The semiconductor package assembly includes a first substrate. A first semiconductor die is disposed on the first substrate. A passive device is located directly on the first semiconductor die. The passive device is disposed within a boundary of the first semiconductor die in a plan view.

38 Claims, 15 Drawing Sheets

(52) U.S. Cl.
CPC ............ *H01L 2224/48265* (2013.01); *H01L 2224/73215* (2013.01); *H01L 2224/73253* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06568* (2013.01); *H01L 2225/06572* (2013.01); *H01L 2225/06582* (2013.01); *H01L 2924/1431* (2013.01); *H01L 2924/1432* (2013.01); *H01L 2924/1436* (2013.01); *H01L 2924/15311* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/19107* (2013.01)

(56) References Cited

U.S. PATENT DOCUMENTS

| | | |
|---|---|---|
| 2004/0082100 A1 | 4/2004 | Tsukahara et al. |
| 2007/0235865 A1 | 10/2007 | Bauer et al. |
| 2009/0057867 A1 | 3/2009 | Hool |
| 2010/0127361 A1 | 5/2010 | Kuan et al. |
| 2013/0277855 A1 | 10/2013 | Kang et al. |

FOREIGN PATENT DOCUMENTS

| | | |
|---|---|---|
| CN | 203733790 | 7/2014 |
| JP | 2008034762 | 2/2008 |
| TW | 200740317 | 10/2007 |
| TW | 200740317 A | 10/2007 |
| TW | 201351579 A | 12/2013 |
| WO | WO 99/17368 | 4/1999 |

SEMICONDUCTOR PACKAGE ASSEMBLY WITH PASSIVE DEVICE

CROSS REFERENCE TO RELATED APPLICATIONS

This application claims the benefit of U.S. Provisional Application No. 62/130,048 filed Mar. 9, 2015, and U.S. Provisional Application No. 62/135,322 filed Mar. 19, 2015, the entirety of which are incorporated by reference herein.

BACKGROUND OF THE INVENTION

Field of the Invention

The present invention relates to a semiconductor package assembly, and in particular to a portable electronic system with a passive device.

Description of the Related Art

In order to ensure miniaturization and multi-functionality of electronic products and communication devices, it is desired that semiconductor packages be small in size, to support multi-pin connection, high speeds, and high functionality. A conventional semiconductor package usually places passive devices embedded in the substrate or disposed on the solder-ball side of the substrate. However, embedded passive devices require complex processing steps and incur a high fabrication cost. Also, the passive devices disposed on the solder-ball side of the substrate are required to be thin, and occupy the space for positioning the solder balls.

Thus, a novel semiconductor package assembly is desirable.

BRIEF SUMMARY OF THE INVENTION

An exemplary embodiment of a semiconductor package assembly is provided. The semiconductor package assembly includes a first substrate. A first semiconductor die is disposed on the first substrate. A passive device is located directly on the first semiconductor die. The passive device is disposed within the boundary of the first semiconductor die in a plan view.

Another exemplary embodiment of a semiconductor package assembly includes a first substrate. A first semiconductor die is disposed on the first substrate. A discrete passive device is located directly on the first semiconductor die. Pads of the passive device fully overlap the first semiconductor die.

Yet another exemplary embodiment of a semiconductor package assembly includes a first substrate. A first semiconductor die is disposed on the first substrate. A discrete passive device is located directly on, and fully overlapping, the first semiconductor die. An overlapping region between the passive device and the first semiconductor die is surrounded by a side surface of the first semiconductor die in a plan view.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
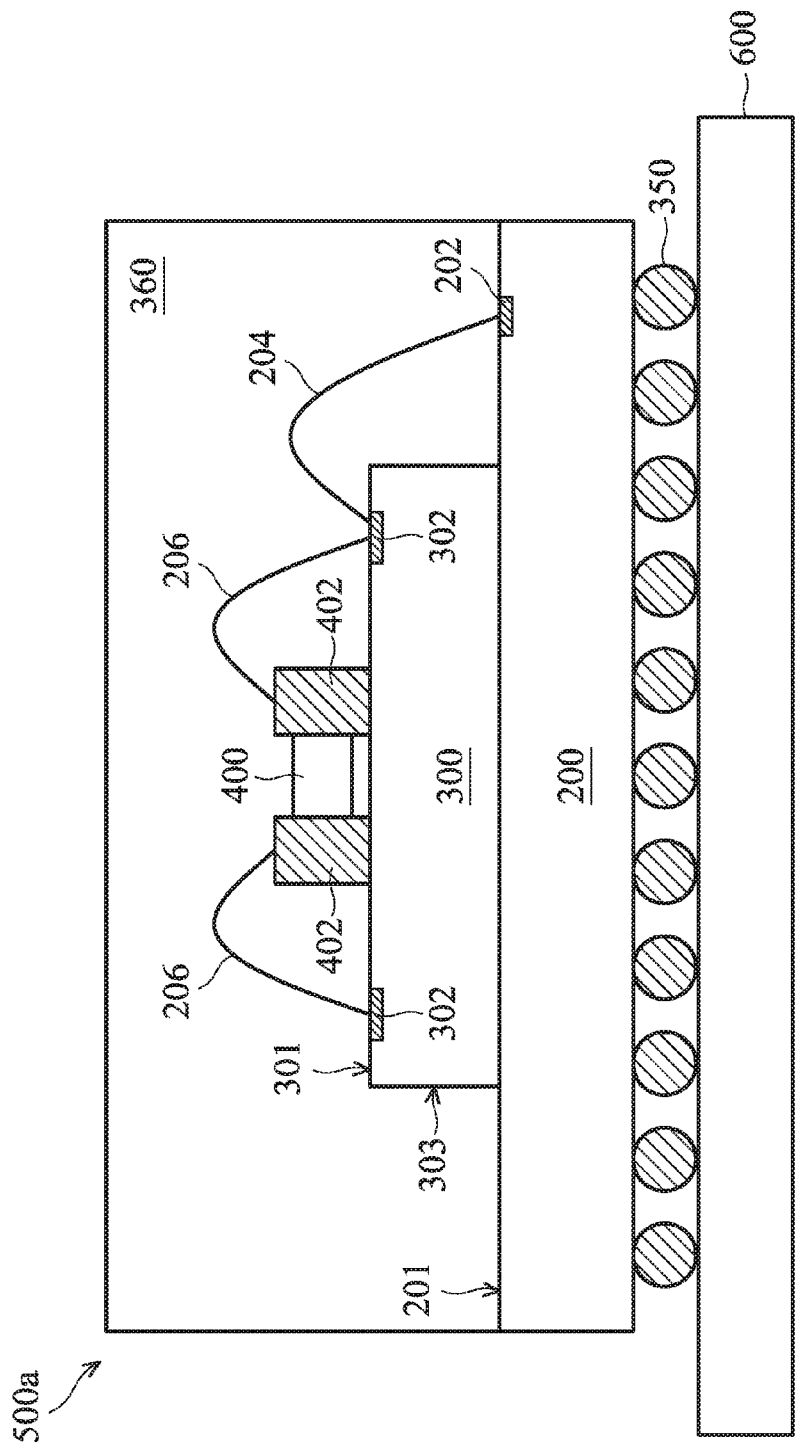
FIGS. 1-3 are cross-sectional views of a semiconductor package assembly in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor package assembly. The semiconductor package assembly is a system-in-package (SIP). The semiconductor package assembly includes a discrete passive device positioned directly on a semiconductor die, which may satisfy the requirements of being cost-efficient and having a small package size while maintaining the size of the passive device and the arrangement of the conductive bumps of the semiconductor package.

Figure 4:
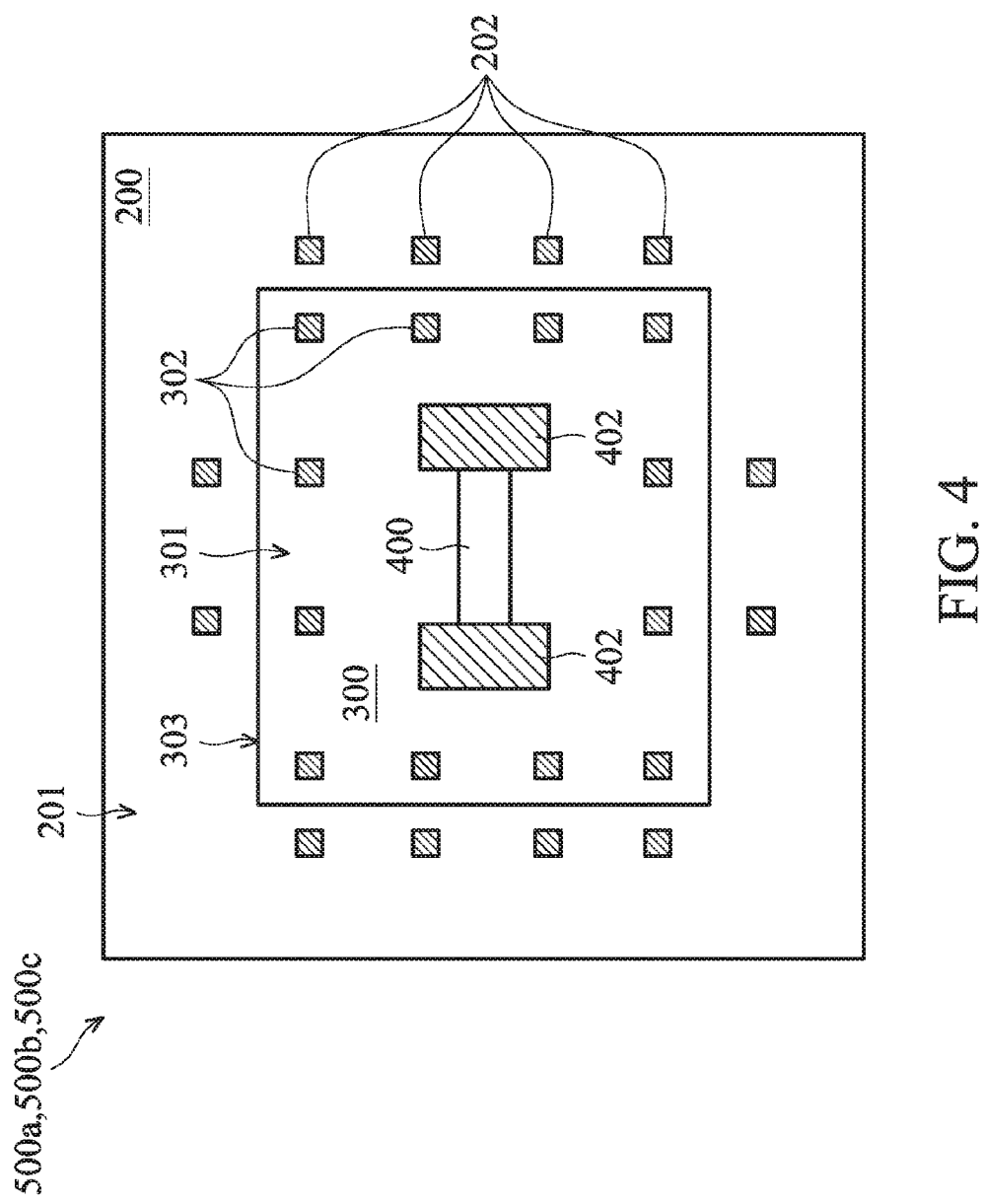
FIG. 4 is a plan view of FIGS. 1-3, showing the arrangement of the substrate, the semiconductor die and the passive device of the semiconductor package assemblies shown in FIGS. 1-3.

FIG. 1 is a cross-sectional view of a semiconductor package assembly 500a in accordance with some embodiments of the disclosure. FIG. 4 is a plan view of FIG. 1, showing the arrangement of the semiconductor package assembly 500a. For clearly showing the arrangement of a substrate, a semiconductor die and a passive device of the semiconductor package assembly 500a, a molding compound and conductive wires of the semiconductor package assembly 500a are not shown in FIG. 4.

As shown in FIG. 1, the semiconductor package assembly 500a is mounted on a base 600 through a plurality of conductive bumps 350. In some embodiments, the base 600 may include a printed circuit board (PCB), and the conductive bumps 350 may include solder bumps. The semiconductor package assembly 500a includes a first substrate 200, a semiconductor die 300 and a passive device 400. It should be noted that the first substrate 200, the semiconductor die 300 and the passive device 400 are discrete, individual elements of the semiconductor package assembly 500a.

As shown in FIGS. 1 and 4, the first substrate 200 is provided for the semiconductor die 300 and the passive device 400 thereon. The first substrate 200 includes at least one pad 202 disposed close to a top surface 201. The pad 202 is used for input/output (I/O) connections of the semiconductor die 300 mounted on the first substrate 200. The first substrate 200 may also include an interconnection (not shown) formed therein to couple to the pad 202. In some embodiments, the first substrate 200 may comprise a semiconductor substrate, such as a silicon substrate. In some other embodiments, the first substrate 200 may comprise a dielectric material such as an organic material. In some embodiments, the organic material includes polypropylene (PP) with glass fiber, epoxy resin, polyimide, cyanate ester, other suitable materials, or a combination thereof.

As shown in FIGS. 1 and 4, the semiconductor die 300 is disposed on the top surface 201 of the first substrate 200. In some embodiments, the semiconductor die 300 is coupled to the first substrate 200 through conductive structures comprising conductive wires or pads. In some embodiments, and as shown in FIG. 1, the semiconductor die 300 is coupled to the first substrate 200 through the wire bonding technology. The semiconductor die 300 may be mounted on the top surface 201 of the first substrate 200 through an adhesion (not shown) between the semiconductor die 300 and the first substrate 200. In some embodiments, the semiconductor die 300 may include a logic die including a central processing unit (CPU), a graphics processing unit (GPU), a dynamic random access memory (DRAM) controller, or any combination thereof.

As shown in FIGS. 1 and 4, the discrete passive device 400 is disposed directly on a top surface 301 of the semiconductor die 300. The passive device 400 is arranged to fully overlap the semiconductor die 300. As shown in FIG. 4, an overlapping region between the passive device 400 and the semiconductor die 300 is surrounded by a side surface 303 of the semiconductor die 300 in a plan view. In other words, the passive device 400 is disposed within a boundary of the top surface 301 of the semiconductor die 300 (i.e. the side surface 303) in a plan view shown in FIG. 4. Pads (terminals) 402 of the passive device 400 also fully overlap the semiconductor die 300. In some embodiments, the passive device 400 may include a capacitor, a resistor, an inductor or a diode and not limited. In some embodiments, and as shown in FIG. 1, the pads (terminals) 402 of the passive device 400 may be bonded on the top surface 301 of the semiconductor die 300. The pads (terminals) 402 of the passive device 400 are coupled to the corresponding pads 302 of the semiconductor die 300 through conductive wires 206. Also, the pads 302 of the semiconductor die 300 are coupled to the corresponding pads 202 of the first substrate 200 through conductive wires 204. In some embodiments, the passive device 400 is coupled to first substrate 200 through the conductive wires 204 and 206.

As shown in FIG. 1, the semiconductor package assembly 500a further includes a molding compound 360 covering the top surface 201 of the first substrate 200, encapsulating the semiconductor die 300, the passive device 400 and the conductive wires 204 and 206. In some embodiments, the molding compound 360 may be formed of a nonconductive material, such as an epoxy, a resin, a moldable polymer, or the like.

Figure 2:
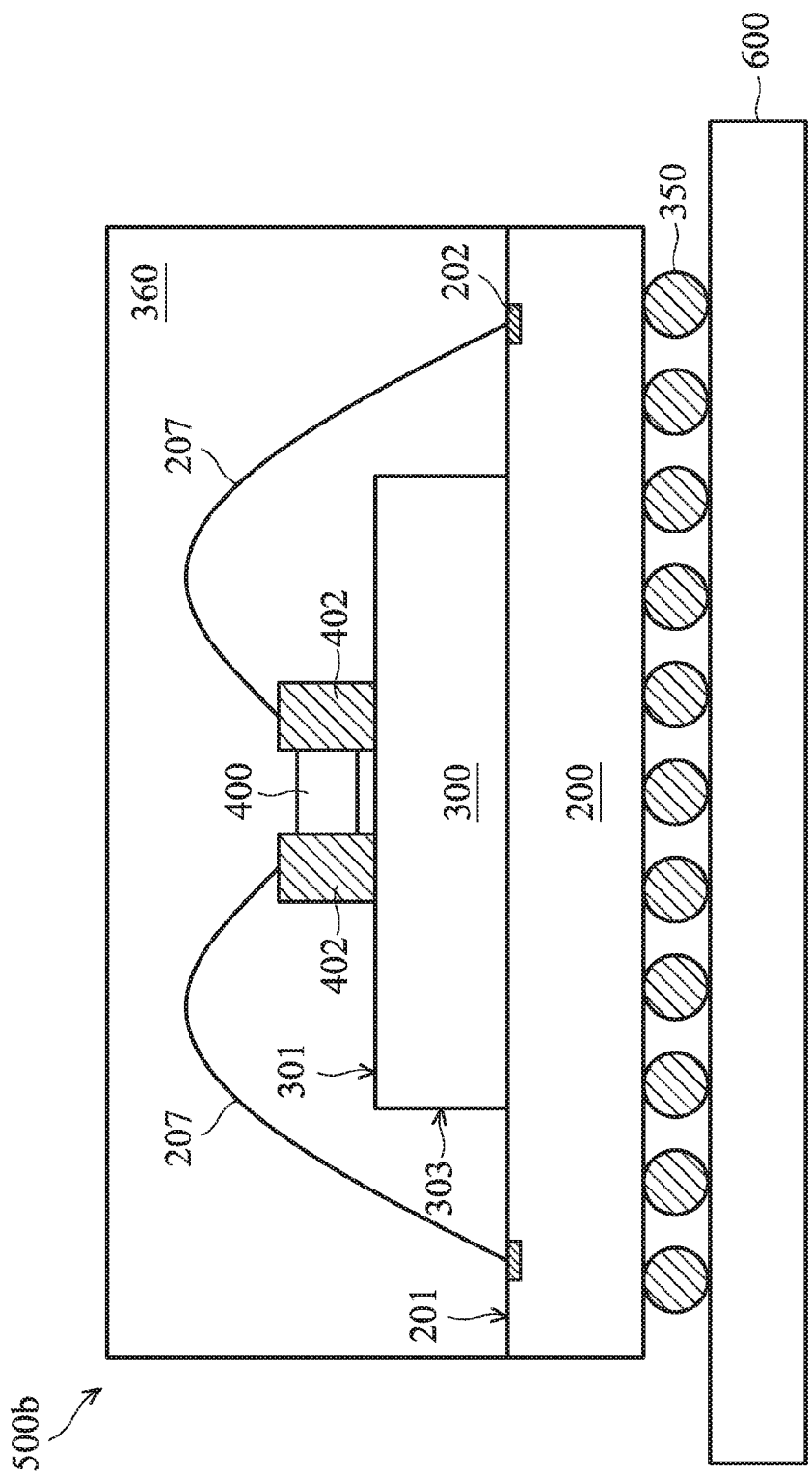

FIG. 2 is a cross-sectional view of a semiconductor package assembly 500b in accordance with some embodiments of the disclosure. FIG. 4 is also a plan view of FIG. 2, showing the arrangement of the semiconductor package assembly 500b. For clearly showing the arrangement of a substrate, a semiconductor die and a passive device of the semiconductor package assembly 500b, a molding compound and conductive wires of the semiconductor package assembly 500b are not shown in FIG. 4. Elements of the embodiments hereinafter that are the same or similar as those previously described with reference to FIG. 1, are not repeated for brevity.

As shown in FIGS. 2 and 4, the semiconductor die 300 of the semiconductor package assembly 500b may be coupled to the first substrate 300 through the flip chip technology. In some embodiments, and as shown in FIG. 2, the pads (terminals) 402 of the passive device 400 are coupled to the corresponding pads 202 of the first substrate 200 through conductive wires 207. In this embodiment, the semiconductor die 300 may comprise a flip-chip semiconductor die. In some other embodiments, the semiconductor die 300 is coupled to the first substrate 200 through the wire bonding technology. For example, the semiconductor die 300 may be mounted on the top surface 201 of the first substrate 200 through an adhesion (not shown) between the semiconductor die 300 and the first substrate 200. Also, the pads of the semiconductor die 300 are coupled to corresponding pads of the first substrate 200 through conductive wires.

Figure 3:
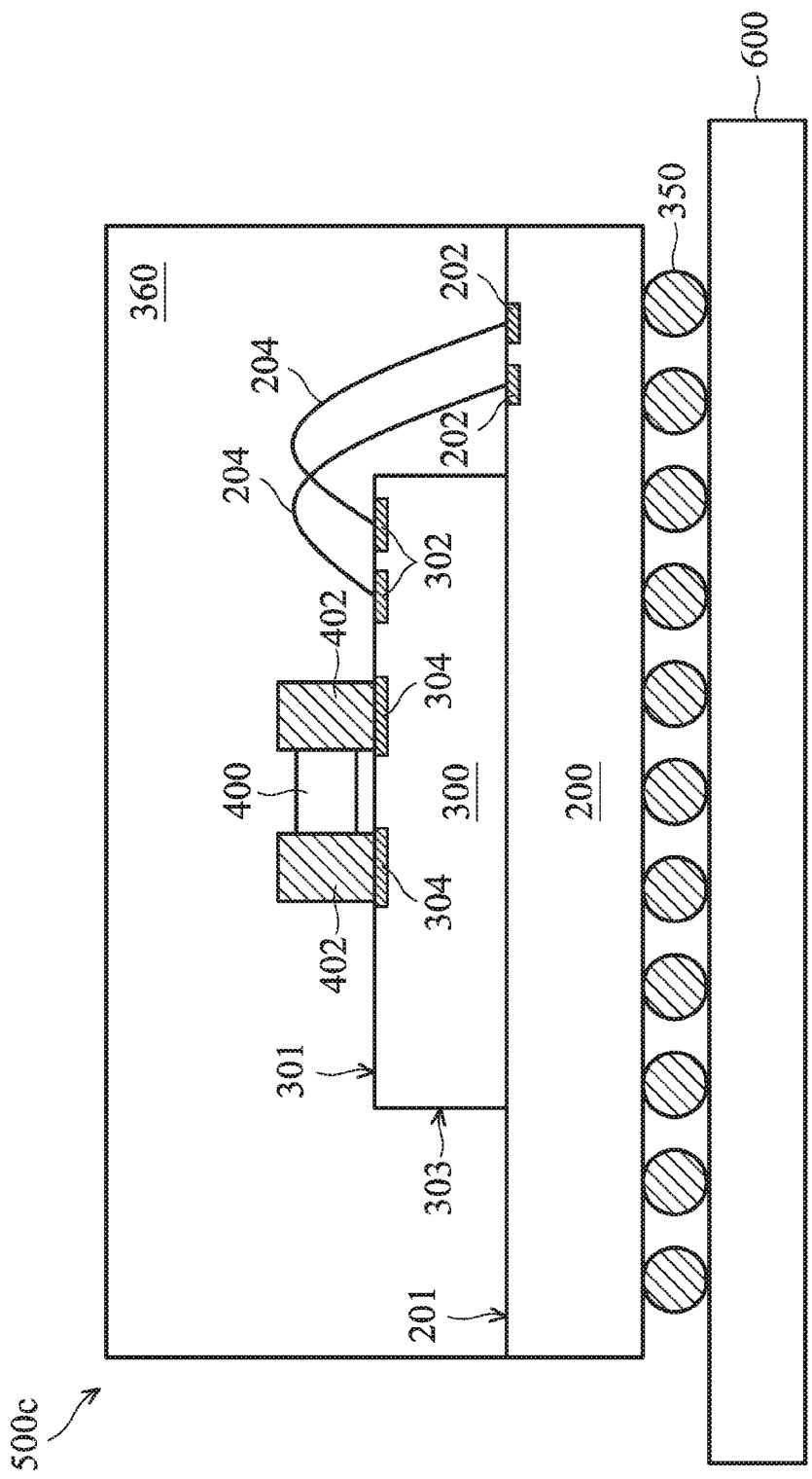

FIG. 3 is a cross-sectional view of a semiconductor package assembly 500c in accordance with some embodiments of the disclosure. FIG. 4 is also a plan view of FIG. 3, showing the arrangement of the semiconductor package assembly 500c. For clearly showing the arrangement of a substrate, a semiconductor die and a passive device of the semiconductor package assembly 500c. A molding compound and conductive wires of the semiconductor package assembly 500c are not shown in FIG. 4. Elements of the embodiments hereinafter that are the same or similar as those previously described with reference to FIG. 1-2, are not repeated for brevity.

As shown in FIGS. 1, 3 and 4, one of the differences between the semiconductor package assemblies 500a and 500c is that the pads (terminals) 402 of the passive device 400 of the semiconductor package assembly 500c connect directly to the corresponding pads 304 of the semiconductor die 300. The pads 304 are disposed close to the top surface 301 of the semiconductor die 300. In this embodiment, the semiconductor die 300 has a redistribution (redirect) function to provide for the passive device 400 mounted thereon. The pads (terminals) 402 of the passive device 400 may be redirected to other positions of the semiconductor die 300 (e.g. the positions of the pads 302) through the interconnection structure and the pads 302 and 304 of the semiconductor die 300.

Figure 5:
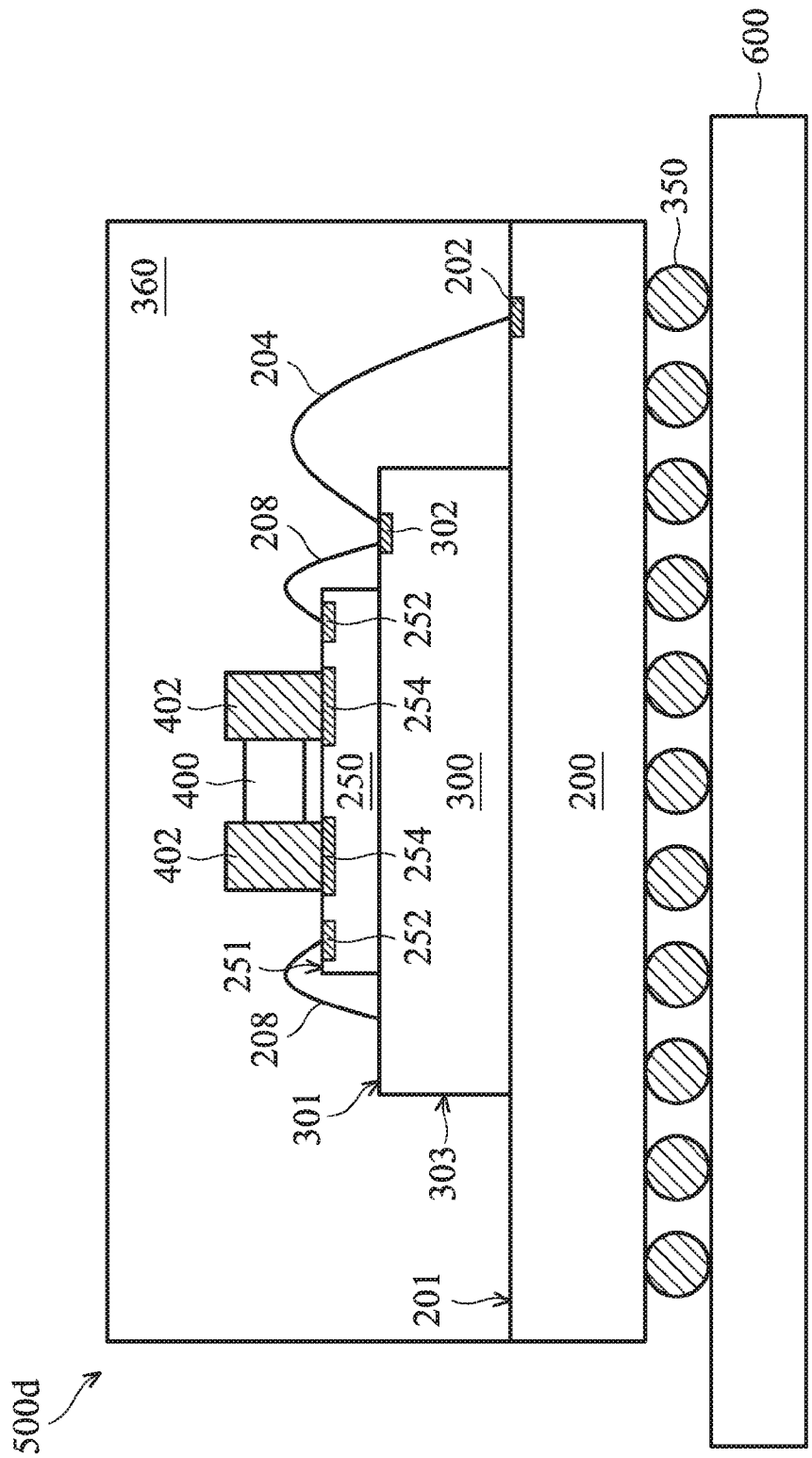
FIG. 5 is a cross-sectional view of a semiconductor package assembly in accordance with some embodiments of the disclosure.
Figure 6:
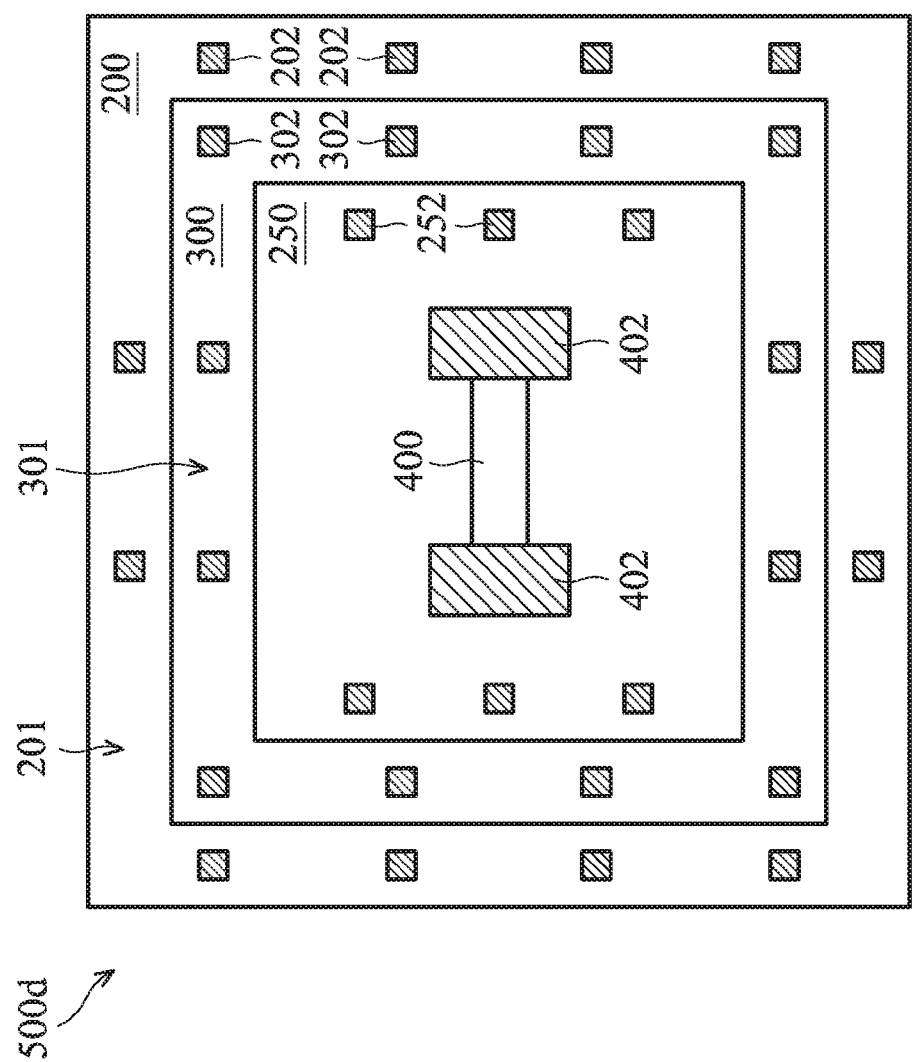
FIG. 6 is a plan view of FIG. 5, showing the arrangement of the substrate, the semiconductor die and the passive device of the semiconductor package assembly shown in FIG. 5.

FIG. 5 is a cross-sectional view of a semiconductor package assembly 500*d* in accordance with some embodiments of the disclosure. FIG. 6 is a plan view of FIG. 5, showing the arrangement of the semiconductor package assembly 500*d*. For clearly showing the arrangement of a first substrate, a semiconductor die, a second substrate and a passive device of the semiconductor package assembly 500*d*, a molding compound and conductive wires of the semiconductor package assembly 500*d* are not shown in FIG. 6. Elements of the embodiments hereinafter that are the same or similar as those previously described with reference to FIG. 1-4, are not repeated for brevity.

As shown in FIGS. 5 and 6, one of the differences between the semiconductor package assembly 500*a* shown in FIG. 1 and the semiconductor package assembly 500*d* is that semiconductor package assembly 500*d* further comprises a carrier, such as second substrate 250, vertically between the semiconductor die 300 and the passive device 400. The discrete passive device 400 is separated from the semiconductor die 300 through the second substrate 250. In some embodiments, the first substrate 200 and the second substrate 250 may have similar structures and may be formed by similar processes. It should be noted that the area of the second substrate 250 is less than that of the semiconductor die 300 and that of the first substrate 200 in a plan view, as shown in FIG. 6. Therefore, the pads 302 of the semiconductor die 300 are exposed from the second substrate 250.

The second substrate 250 includes pads 252 and 254 close to a top surface 251. Also, the second substrate 250 includes interconnection structures (not shown) coupled to the pads 252 and 254. In this embodiment, the second substrate 250 is designed to have the redistribution (redirect) function to provide for the passive device 400 mounted thereon. The passive device 400 is bonded on the second substrate 250, and the pads (terminals) 402 of the passive device 400 may be redirected to specific positions of the second substrate 250 (e.g. positions of the pads 208) through the routings (or the interconnection structure) and the pads 252 and 254 of the second substrate 250. For example, the pads (terminals) 402 of the passive device 400 of the semiconductor package assembly 500*d* connect directly to the corresponding pads 254 of the second substrate 250. The pads 254 covered by the passive device 400 can be designed to be coupled to the pads 252, which are exposed from the passive device 400. Therefore, the passive device 400 can be coupled to the semiconductor die 300 through conductive wires 208.

Figure 7:
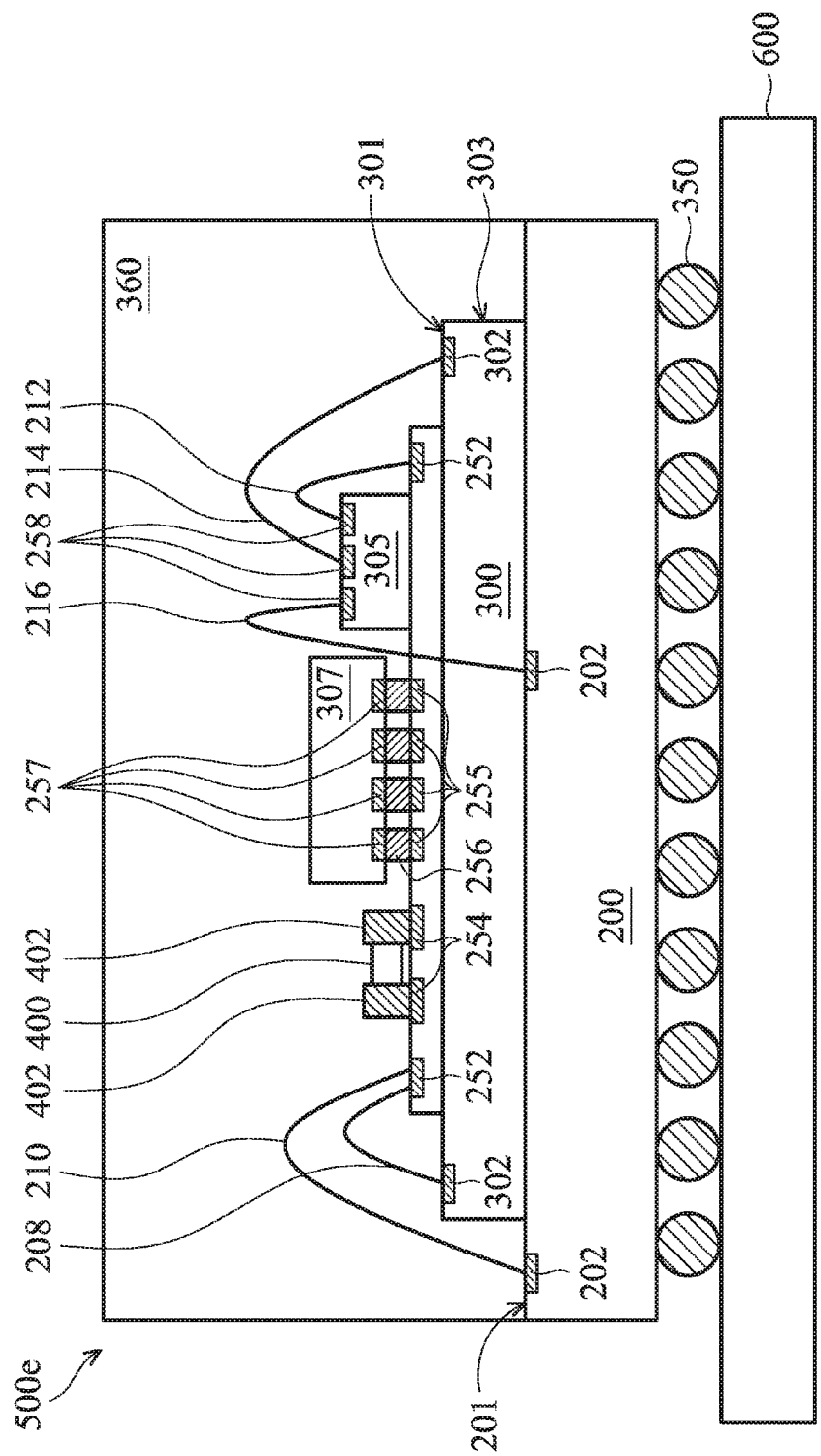
FIG. 7 is a cross-sectional view of a semiconductor package assembly in accordance with some embodiments of the disclosure.
Figure 8:
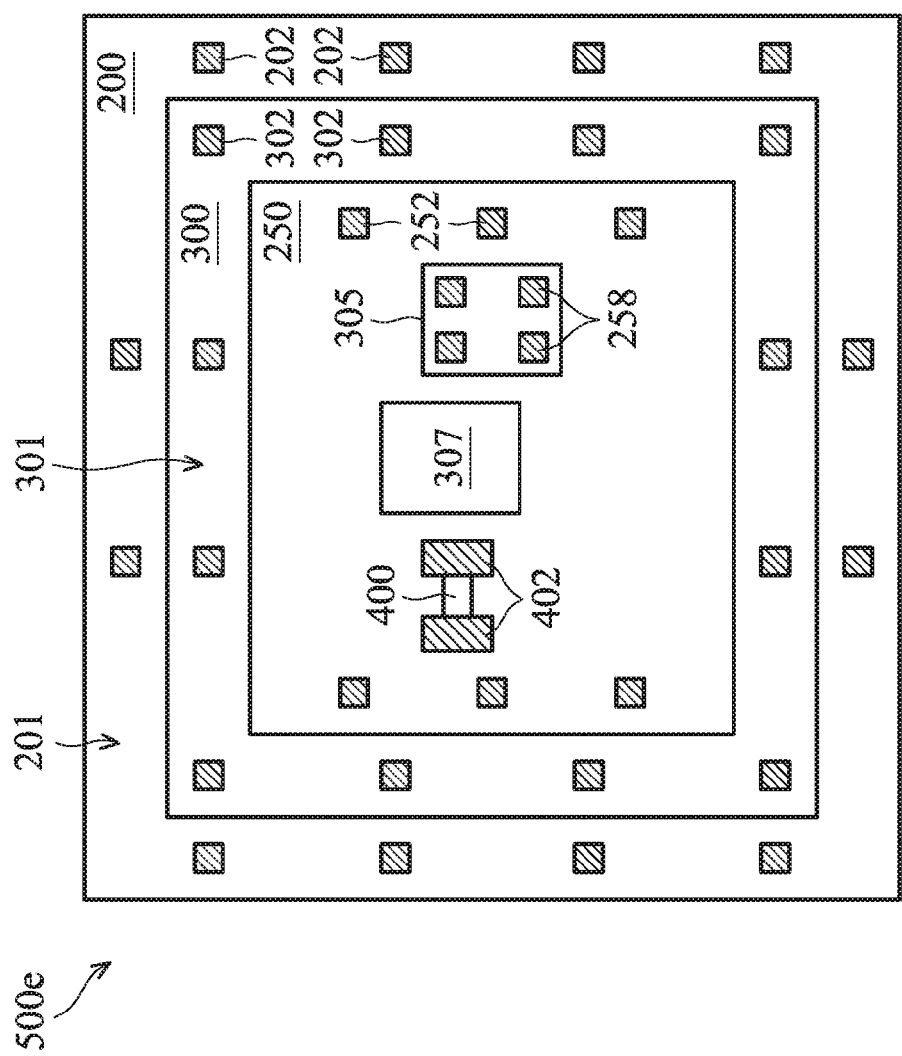
FIG. 8 is a plan view of FIG. 7, showing the arrangement of the substrate, the semiconductor die and the passive device of the semiconductor package assembly shown in FIG. 7.

FIG. 7 is a cross-sectional view of a semiconductor package assembly 500*e* in accordance with some embodiments of the disclosure. FIG. 8 is a plan view of FIG. 7, showing the arrangement of the semiconductor package assembly 500*e*. For clearly showing the arrangement of a first substrate, semiconductor dies, a second substrate and a passive device of the semiconductor package assembly 500*e*, a molding compound and conductive wires of the semiconductor package assembly 500*e* are not shown in FIG. 8. Elements of the embodiments hereinafter that are the same or similar as those previously described with reference to FIG. 1-6, are not repeated for brevity.

As shown in FIGS. 7 and 8, one of the differences between the semiconductor package assembly 500*d* shown in FIGS. 5-6 and the semiconductor package assembly 500*e* is that semiconductor package assembly 500*e* further comprises one or more semiconductor dies, such as semiconductor dies 307 and 305, disposed directly on the second substrate 250. Also, the passive device 400 is disposed beside the semiconductor dies 307 and 305. The pads 252 of the second substrate 250 are exposed from the passive device 400 and the semiconductor dies 307 and 305.

As shown in FIG. 7, in some embodiments, the semiconductor dies 307 and 305 are coupled to the second substrate 250 through conductive structures. More specifically, pads 257 of the semiconductor die 307 are coupled to pads 255 of the second substrate 250 through conductive bumps 256. Some of pads 258 of the semiconductor die 305 are coupled to the corresponding pads 252 of the second substrate 250 through conductive wires 212. Also, some of the pads 258 of the semiconductor die 305 are coupled to the corresponding pads 302 of the semiconductor die 300 through conductive wires 214. Some other pads 258 of the semiconductor die 305 are coupled to the corresponding pads 202 of the first substrate 200 through conductive wires 216. In this embodiment, the semiconductor die 300 may comprise a flip-chip semiconductor die.

In this embodiment, and as shown in FIG. 7, the second substrate 250 is designed to have the redistribution (redirect) function to provide for the passive device 400, the semiconductor dies 307 and 305 mounted thereon. The pads (terminals) 402 of the passive device 400, the pads 257 of the semiconductor die 307 and the pads 258 of the semiconductor die 305 may be redirected to specific positions of the second substrate 250 (e.g. positions of the pads 252) through the routings (or the interconnection structure) and the pads 252 and 255 of the second substrate 250.

In this embodiment, and as shown in FIG. 7, the pads 252 of the second substrate 250 are exposed from the passive device 400, the semiconductor dies 307 and 305. The pads 252 of the second substrate 250 are coupled to the pads 302 of the semiconductor die 300 through conductive wires 208. The pads 252 of the second substrate 250 are coupled to the corresponding pads 202 of the first substrate 200 through conductive wires 210.

Figure 9:
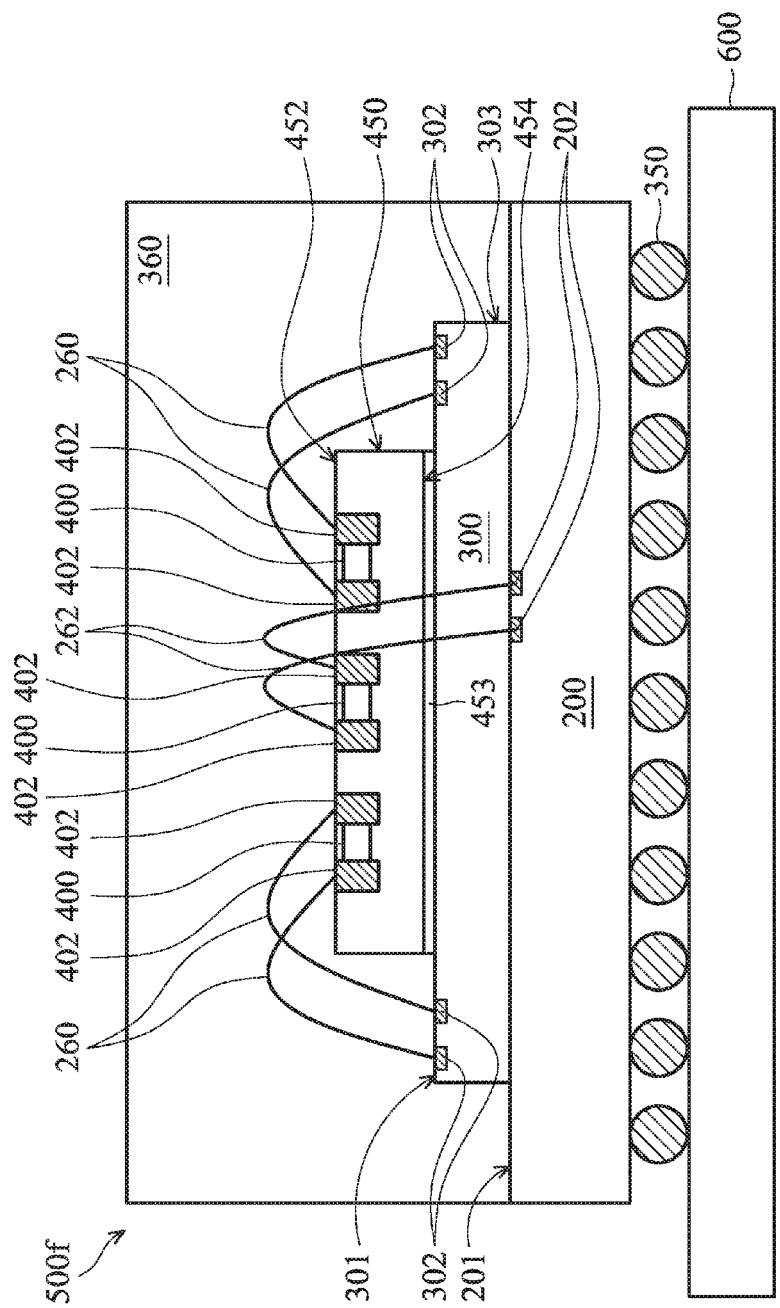
FIG. 9 is a cross-sectional view of a semiconductor package assembly in accordance with some embodiments of the disclosure.
Figure 10:
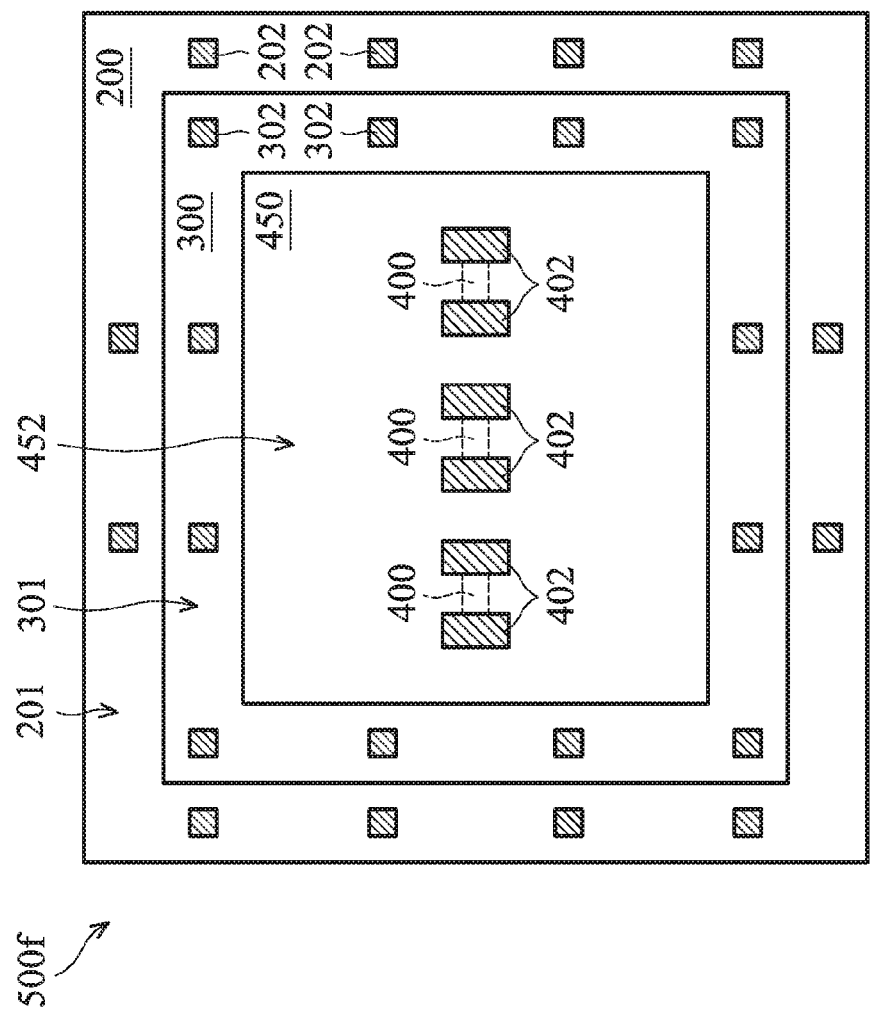
FIG. 10 is a plan view of FIG. 9, showing the arrangement of the substrate, the semiconductor die and the passive device of the semiconductor package assembly shown in FIG. 9.

FIG. 9 is a cross-sectional view of a semiconductor package assembly 500*f* in accordance with some embodiments of the disclosure. FIG. 10 is a plan view of FIG. 9, showing the arrangement of the semiconductor package assembly 500*f*. For clearly showing the arrangement of a first substrate, semiconductor dies, a second substrate, a passive device and a carrier of the semiconductor package assembly 500*f*, a molding compound and conductive wires of the semiconductor package assembly 500*f* are not shown in FIG. 10. Elements of the embodiments hereinafter that are the same or similar as those previously described with reference to FIG. 1-8, are not repeated for brevity.

As shown in FIGS. 9 and 10, one of the differences between the semiconductor package assembly 500*a* shown in FIG. 1 and the semiconductor package assembly 500*f* is that semiconductor package assembly 500*d* further comprises a carrier; for example, an insulating material brick 450 located directly on the semiconductor die 300. The discrete passive devices 400 are embedded in the insulating material brick 450. Therefore, the passive devices 400 are separated from the semiconductor die 300 through the insulating material brick 450. In some embodiments, and as shown in FIG. 9, the insulating material brick 450 may be mounted on the top surface 301 of the semiconductor die 300 through adhesion 453 between the insulating brick 450 and the semiconductor die 300 and the first substrate 200. In this embodiment, the semiconductor die 300 may comprise a flip-chip semiconductor die.

As shown in FIGS. 9 and 10, the pads (terminals) 402 of the passive devices 400 are exposed from a surface 452 of the insulating material brick 450, which is located away from the semiconductor die 300. In some embodiments, the insulating material brick 450 is formed of insulating materials. The insulating material brick 450 is free from any conductive structure coupled to the passive devices 400, so that the passive devices 400 are coupled to the semiconductor die 300 and/or the first substrate 200 only through external conductive structures, which are disposed outside of the insulating material brick 450. For example, the pads (terminals) 402 of the passive devices 400 are coupled to the pads 302 of the semiconductor die 300 through conductive wires 260. The pads (terminals) 402 of the passive devices 400 are coupled to the corresponding pads 202 of the first substrate 200 through conductive wires 262.

Figure 11:
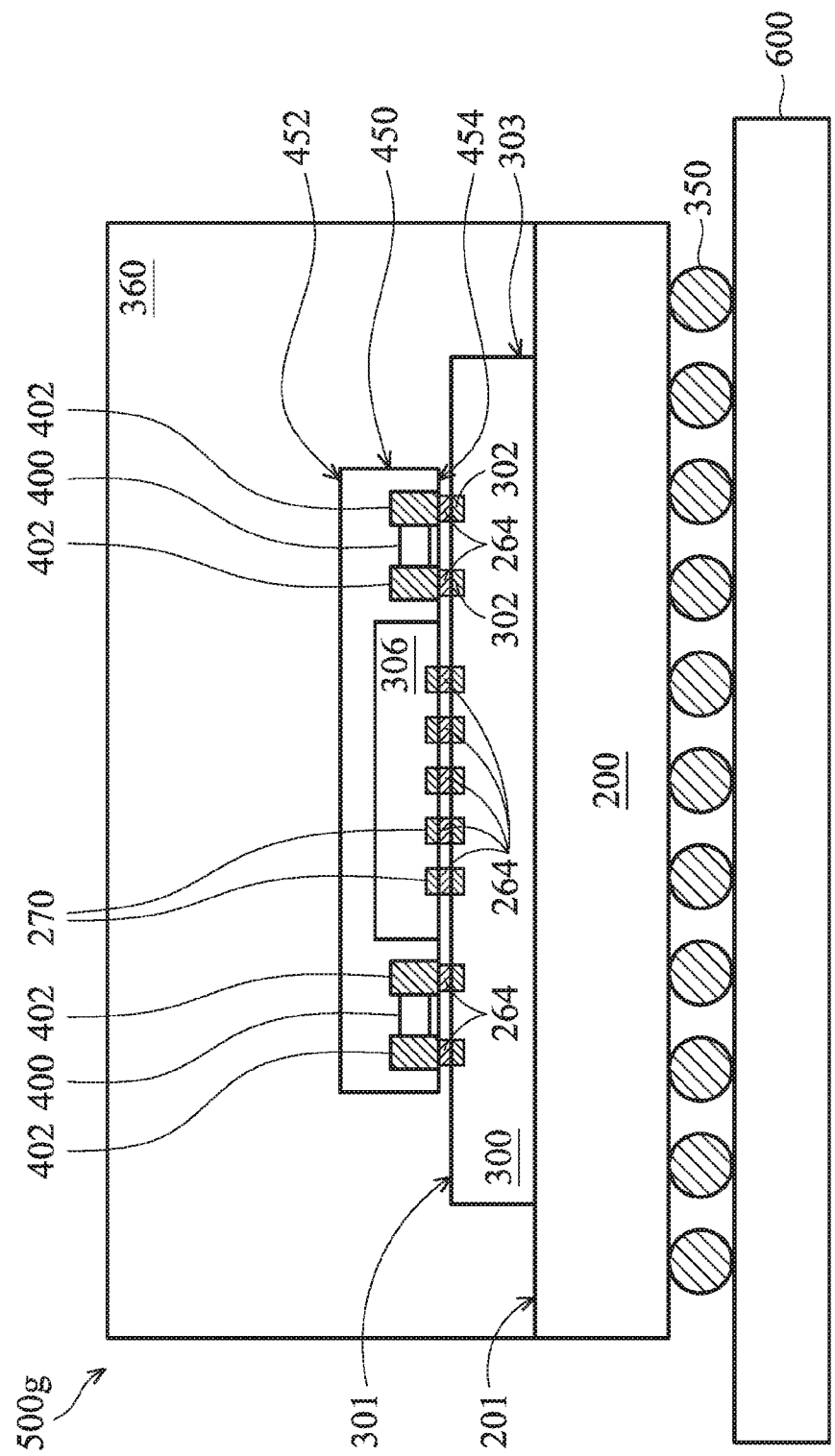
FIG. 11 is a cross-sectional view of a semiconductor package assembly in accordance with some embodiments of the disclosure.
Figure 12:
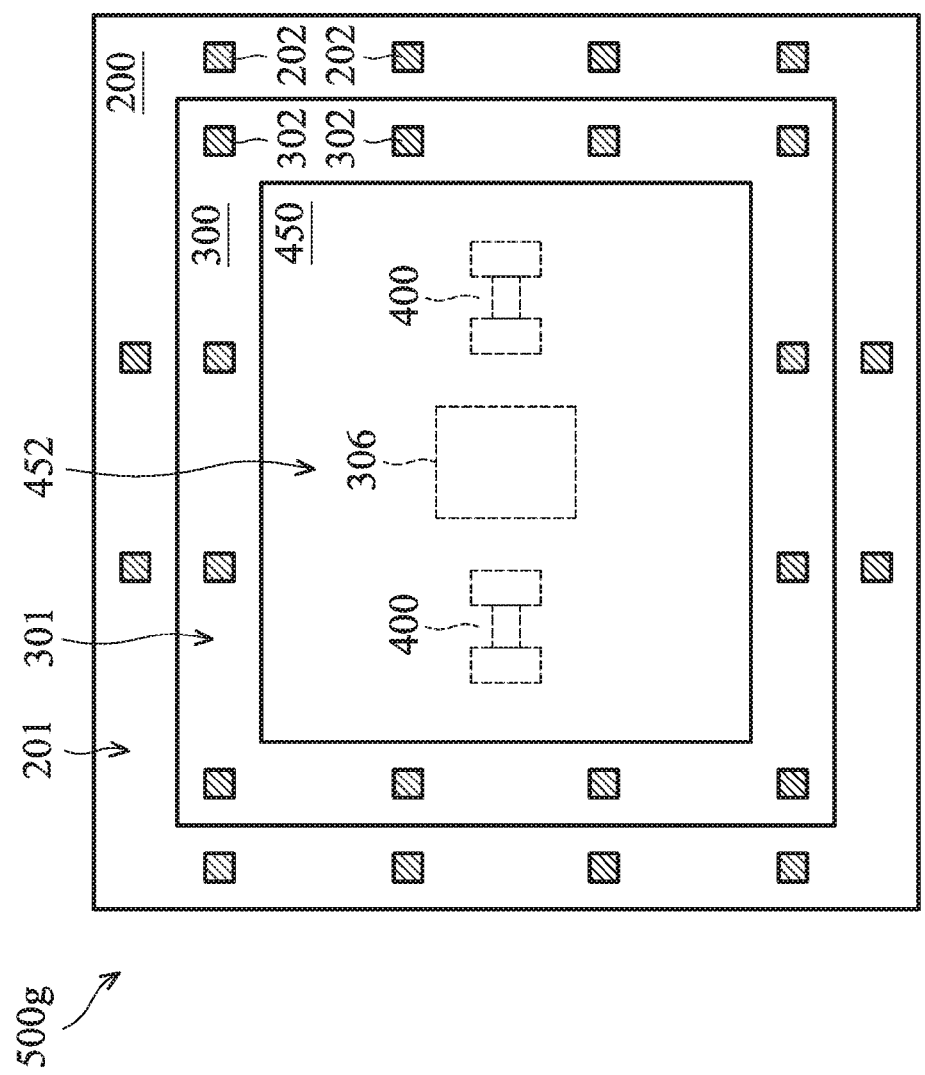
FIG. 12 is a plan view of FIG. 11, showing the arrangement of the substrate, the semiconductor die and the passive device of the semiconductor package assembly shown in FIG. 11.

FIG. 11 is a cross-sectional view of a semiconductor package assembly 500g in accordance with some embodiments of the disclosure. FIG. 12 is a plan view of FIG. 11, showing the arrangement of the semiconductor package assembly 500g. For clearly showing the arrangement of a first substrate, semiconductor dies, a second substrate, a passive device and a carrier of the semiconductor package assembly 500g. A molding compound and conductive wires of the semiconductor package assembly 500g are not shown in FIG. 12. Elements of the embodiments hereinafter that are the same or similar as those previously described with reference to FIG. 1-10, are not repeated for brevity.

As shown in FIGS. 11 and 12, one of the differences between the semiconductor package assembly 500f shown in FIGS. 9-10 and the semiconductor package assembly 500g is that the semiconductor package assembly 500g further comprises a semiconductor die 306 embedded in the insulating brick 450. The semiconductor die 306 is separated from the passive devices 400 through the insulating brick 450. As shown in FIG. 11, the pads (terminals) 402 of the passive devices 400 and pads 270 of the semiconductor die 306 are exposed from a surface 454 of the insulating material brick 450. The surface 454 is opposite from the surface 452 and close to the semiconductor die 300. Therefore, the pads (terminals) 402 of the passive devices 400 and the pads 270 of the semiconductor die 306 are coupled to the pads 302 of the semiconductor die 300 through conductive bumps 264, which are disposed outside of the insulating material brick 450. The pads 302 of the semiconductor die 300 connecting to the conductive bumps 264 are covered by the insulating brick 450. Also, the passive devices 400 and the semiconductor die 306 are covered by the insulating brick 450 in the plan view, as shown in FIG. 12. In this embodiment, the semiconductor die 300 may comprise a flip-chip semiconductor die. In some other embodiments, the semiconductor die 300 is coupled to the first substrate 200 through the wire bonding technology. For example, the semiconductor die 300 may be mounted on the top surface 201 of the first substrate 200 through an adhesion (not shown) between the semiconductor die 300 and the first substrate 200. Also, the pads of the semiconductor die 300 are coupled to corresponding pads of the first substrate 200 through conductive wires.

Figure 13:
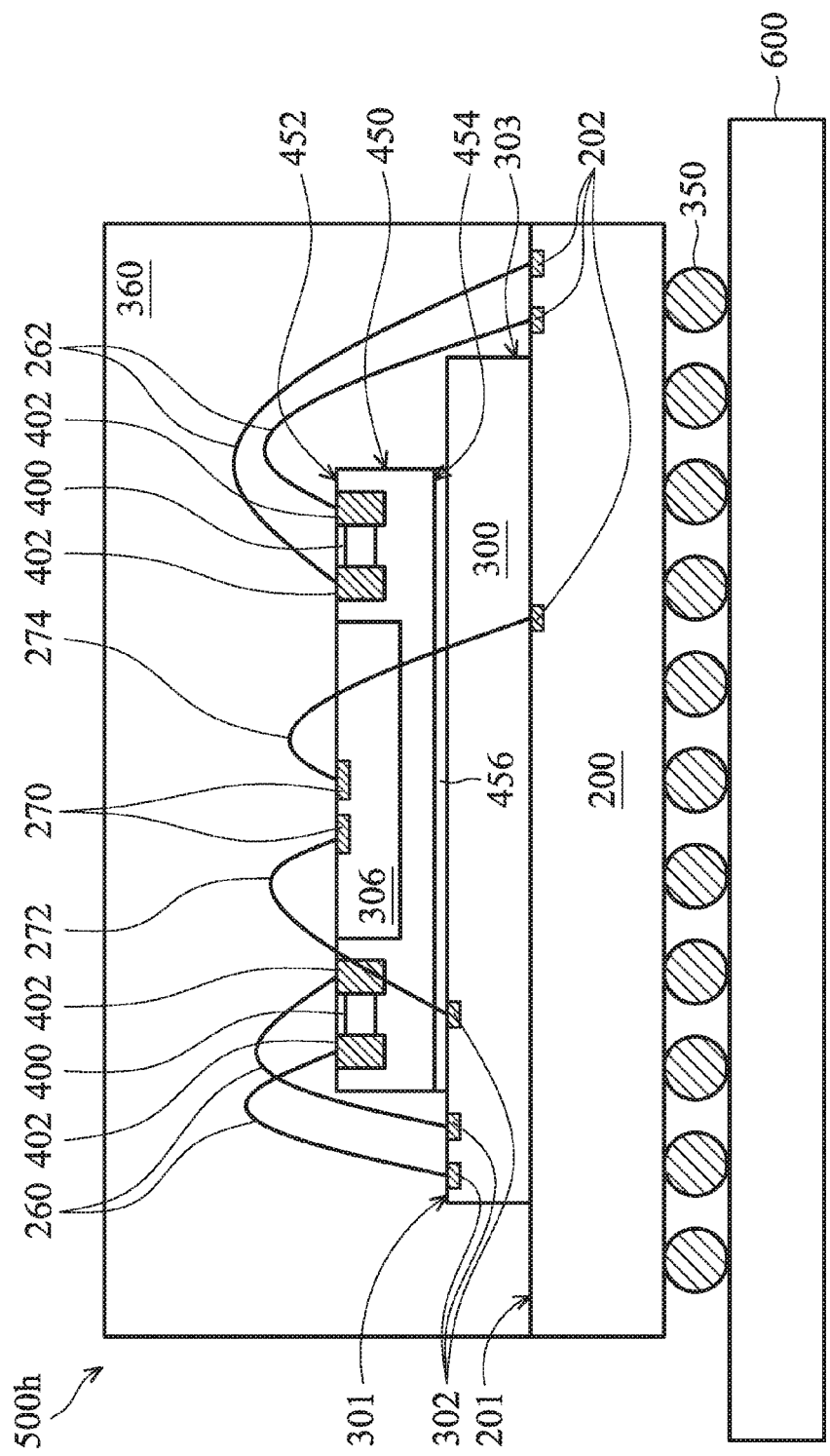
FIGS. 13-14 area cross-sectional views of a semiconductor package assembly in accordance with some embodiments of the disclosure.
Figure 15:
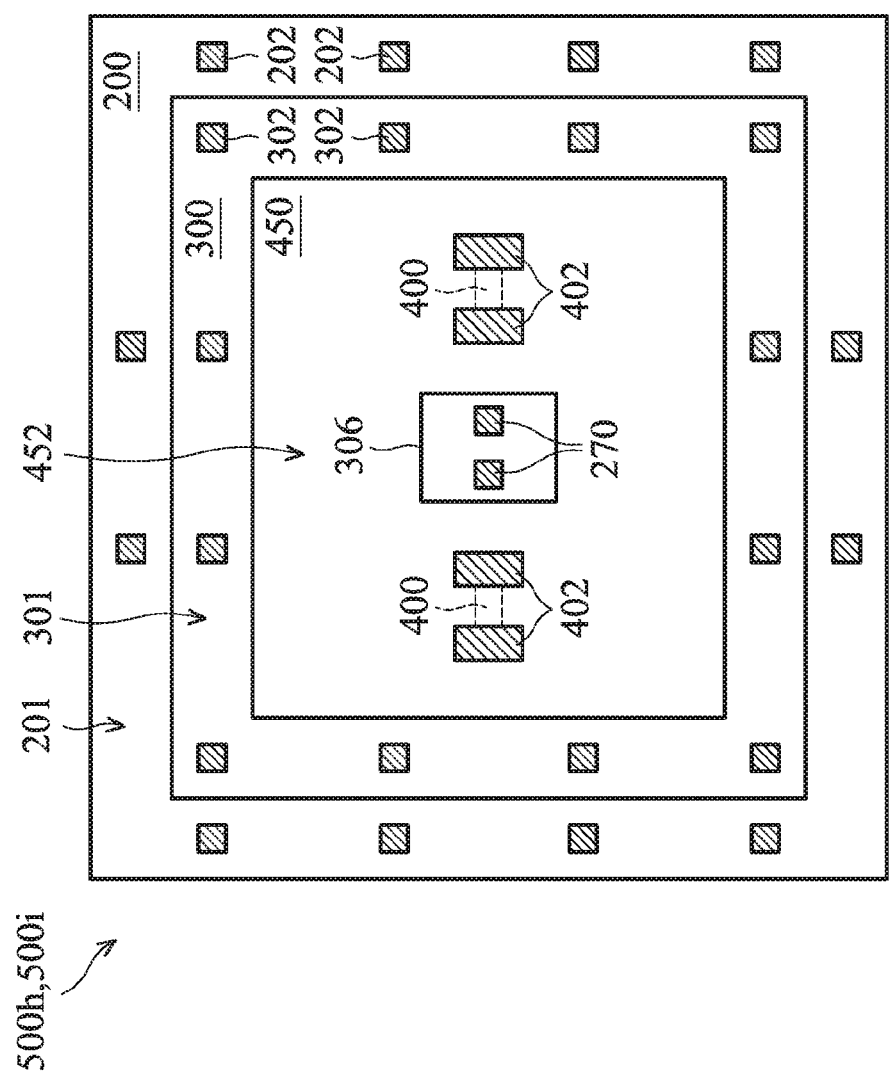
FIG. 15 is a plan view of FIGS. 13-14, showing the arrangement of the substrate, the semiconductor die and the passive device of the semiconductor package assemblies shown in FIGS. 13-14.

FIG. 13 is a cross-sectional view of a semiconductor package assembly 500h in accordance with some embodiments of the disclosure. FIG. 15 is a plan view of FIG. 13, showing the arrangement of the semiconductor package assembly 500h. For clearly showing the arrangement of a first substrate, semiconductor dies, a second substrate, a passive device and a carrier of the semiconductor package assembly 500h, a molding compound and conductive wires of the semiconductor package assembly 500h are not shown in FIG. 15. Elements of the embodiments hereinafter that are the same or similar as those previously described with reference to FIG. 1-12, are not repeated for brevity.

As shown in FIGS. 13 and 15, one of the differences between the semiconductor package assembly 500g shown in FIGS. 11-12 and the semiconductor package assembly 500h is that the pads (terminals) 402 of the passive devices 400 and the pads 270 of the semiconductor die 306 are exposed from the surface 452 of the insulating material brick 450, which is located away from the semiconductor die 300. Also, the surface of the semiconductor die 306 for the pads 270 to be disposed on is exposed from the surface 452 of the insulating material brick 450 in the plan view, as shown in FIG. 15. Because the insulating material brick 450 is free from any conductive structure coupled to the passive devices 400 and the semiconductor die 300, the passive devices 400 and the semiconductor die 300 are coupled to the semiconductor die 300 and/or the first substrate 200 only through external conductive structures, which are disposed outside of the insulating material brick 450. For example, the pads (terminals) 402 of the passive devices 400 and the pads 270 of the semiconductor die 306 are coupled to the pads 302 of the semiconductor die 300 through conductive wires 260 and 272. The pads (terminals) 402 of the passive devices 400 and the pads 270 of the semiconductor die 306 are coupled to the corresponding pads 202 of the first substrate 200 through conductive wires 262 and 274.

Alternatively, the passive devices 400 of the semiconductor package assembly 500f, 500g or 500h may respectively be disposed close to the surfaces 452 and 454 of the same insulating material brick 450. Therefore, the pads (terminals) 402 of the different passive devices 400 may respectively be exposed from both the surfaces 452 and 454 of the insulating material brick 450. Similarly, the semiconductor die 306 and the passive device 400 beside thereto may respectively be disposed close to the surfaces 452 and 454 of the same insulating material brick 450. Therefore, the pads 270 of the semiconductor die 306 and the pads (terminals) 402 of the passive device 400 may respectively be exposed from both the surfaces 452 and 454 of the insulating material brick 450. It should be noted that the passive devices 400 and the semiconductor die 306 embedded in the insulating material brick 450 may use the conductive bumps and conductive wires to electrically connect to the semiconductor die 300 and/or the first substrate 200.

Figure 14:
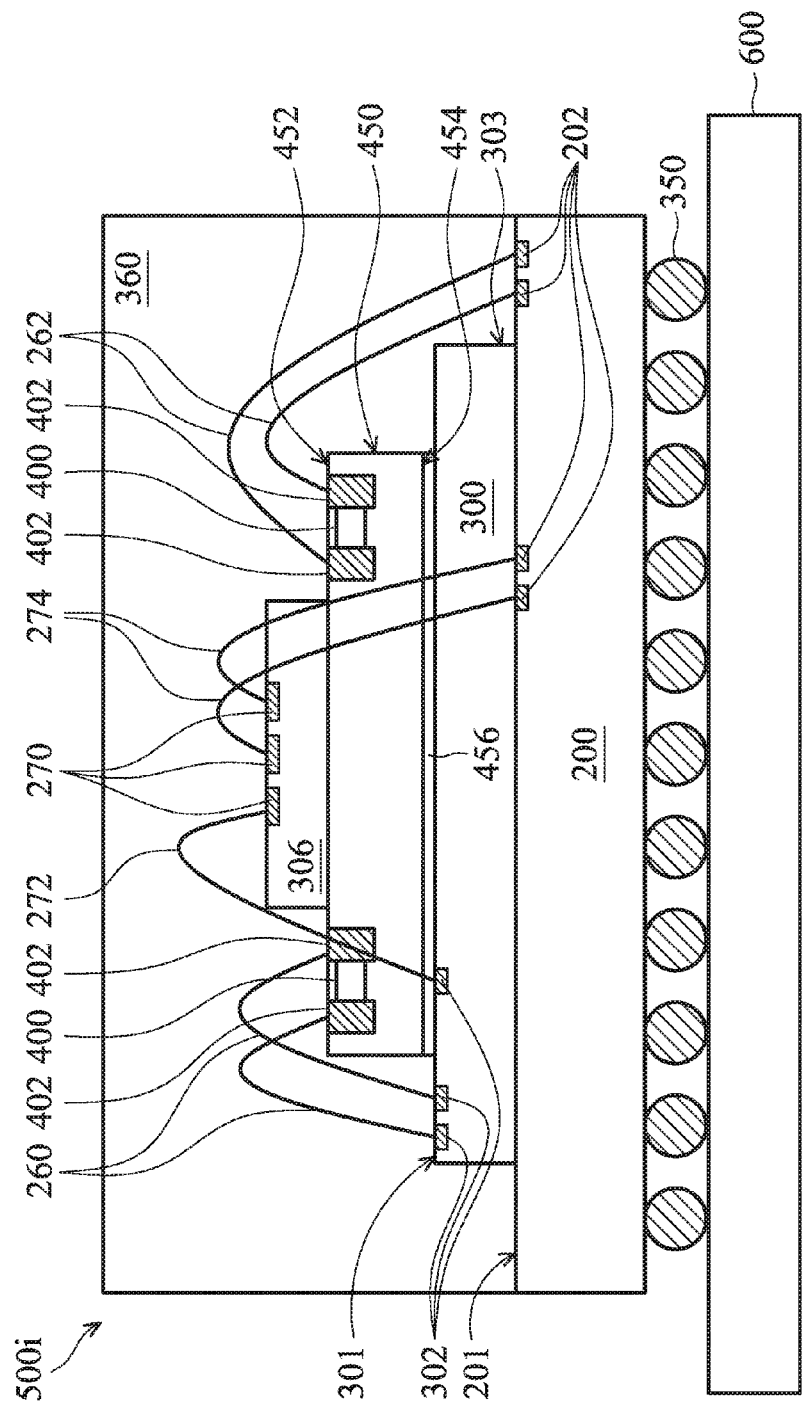

FIG. 14 is a cross-sectional view of a semiconductor package assembly 500i in accordance with some embodiments of the disclosure. FIG. 15 is also a plan view of FIG. 14, showing the arrangement of the semiconductor package assembly 500i. For clearly showing the arrangement of a first substrate, semiconductor dies, a second substrate, a passive device and a carrier of the semiconductor package assembly 500i, a molding compound and conductive wires of the semiconductor package assembly 500h are not shown in FIG. 15. Elements of the embodiments hereinafter that are the same or similar as those previously described with reference to FIG. 1-13, are not repeated for brevity.

As shown in FIGS. 13 and 15, one of the differences between the semiconductor package assembly 500h shown in FIGS. 13 and 15 and the semiconductor package assembly 500i is that the semiconductor die 306 of the semiconductor package assembly 500i is disposed directly on the insulating brick 450. As shown in FIG. 13, the semiconductor die 306 is disposed outside of the insulating brick 450. More specifically, the semiconductor die 306 is disposed directly on the surface 450 of the insulating brick 450, which is located away from the semiconductor die 300. In some embodiments, the semiconductor die 306 is disposed beside the passive devices 400 without covering the pads (terminals) 402 of the passive devices 400. The surface of the semiconductor die 306 for the pads 270 to be disposed on is exposed from the surface 452 of the insulating material brick 450 in the plan view, as shown in FIG. 15. Also, the pads 270 of the semiconductor die 306 are not coplanar with the pads (terminals) 402 of the passive devices 400.

Embodiments provide a semiconductor package assembly. The semiconductor package assembly includes a first substrate, a semiconductor die mounted on the first substrate, and a discrete passive device positioned directly on the semiconductor die. In some embodiments, the discrete passive device can be coupled directly to the pads of the first semiconductor die. Alternatively, the passive device can be coupled to the semiconductor die through the conductive wires. In some embodiments, the discrete passive device can be separated from the semiconductor die through a carrier therebetween. The area of the carrier is designed to be less than that of the semiconductor die and that of the first substrate. The carrier may comprise a second substrate or an insulating material brick. When the carrier includes the second substrate, the passive device may be disposed on the second substrate with the redistribution (redirect) function. Also, the second substrate may provide for another semiconductor die mounted thereon. The terminals (pads) of the passive device may be redirected to other positions of the second substrate through the routings in the second substrate. Alternatively, the second substrate may provide for another semiconductor die embedded therein. When the carrier includes the insulating material brick for the passive device to be embedded therein, the insulating material brick is free from any conductive structure coupled to the passive device. The pads of the passive device are exposed from the surface of the insulating material brick to couple to the semiconductor die and/or the first substrate only through external conductive structures. Alternatively, the insulating material brick may provide for another semiconductor die embedded therein or disposed thereon. The semiconductor package assembly may satisfy the requirements of being cost-efficient and having a small package size while maintaining the size of the passive device and the arrangement of the conductive bumps of the semiconductor package.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor package assembly, comprising:
a first substrate;
a first semiconductor die disposed on the first substrate;
a passive device located directly above the first semiconductor die, wherein the passive device is disposed within a boundary of the first semiconductor die in a plan view; and
an insulating material brick, wherein the passive device is embedded in the insulating material brick, and wherein a pad of the passive device connects directly to a pad of the first semiconductor die through a conductive wire.

2. The semiconductor package assembly as claimed in claim 1, wherein pads of the passive device connect directly to pads of the first semiconductor die.

3. The semiconductor package assembly as claimed in claim 1, further comprising a second substrate between the first semiconductor die and the passive device, wherein pads of the first semiconductor die are exposed form the second substrate.

4. The semiconductor package assembly as claimed in claim 3, wherein the pads of the passive device directly attach onto pads of the second substrate.

5. The semiconductor package assembly as claimed in claim 3, wherein an area of the second substrate is less than that of the first semiconductor die and that of the first substrate.

6. The semiconductor package assembly as claimed in claim 3, wherein the second substrate is coupled to the pads of the first semiconductor die only through conductive wires.

7. The semiconductor package assembly as claimed in claim 3, further comprising a second semiconductor die disposed directly on the second substrate.

8. The semiconductor package assembly as claimed in claim 3, wherein the passive device is disposed beside the second semiconductor die.

9. The semiconductor package assembly as claimed in claim 1, further comprising an insulating material brick directly above the first semiconductor die, wherein the passive device is embedded in the insulating material brick.

10. The semiconductor package assembly as claimed in claim 9, wherein the insulating material brick is free from any conductive structure coupled to the passive device.

11. The semiconductor package assembly as claimed in claim 9, wherein pads of the passive device are exposed from a first surface of the insulating material brick.

12. The semiconductor package assembly as claimed in claim 9, wherein the insulating material brick covers pads of the first semiconductor die.

13. The semiconductor package assembly as claimed in claim 11, further comprising a third semiconductor die embedded in the insulating brick, wherein the third semiconductor die is separated from the passive device.

14. The semiconductor package assembly as claimed in claim 13, wherein pads of the third semiconductor die are exposed from a second surface of the insulating material brick.

15. The semiconductor package assembly as claimed in claim 14, wherein the second surface is opposite from the first surface.

16. The semiconductor package assembly as claimed in claim 9, further comprising an additional semiconductor die directly on the insulating brick, without covering pads of the passive device.

17. A semiconductor package assembly, comprising:
a first substrate;
a first semiconductor die disposed on the first substrate;
a discrete passive device located directly above the first semiconductor die, wherein pads of the passive device fully overlap the first semiconductor die; and
an insulating material brick, wherein the passive device is embedded in the insulating material brick, and wherein one of the pads of the passive device connects directly to a pad of the first semiconductor die through a conductive wire.

18. The semiconductor package assembly as claimed in claim 17, wherein the discrete passive device is separated from the first semiconductor die through a carrier.

19. The semiconductor package assembly as claimed in claim 17, wherein the carrier comprises a second substrate or an insulating material brick.

20. The semiconductor package assembly as claimed in claim 19, wherein the pads of the passive device directly attach onto pads of the second substrate.

21. The semiconductor package assembly as claimed in claim 19, wherein the passive device is embedded in an insulating brick.

22. The semiconductor package assembly as claimed in claim 21, wherein the pads of the passive device are exposed from a first surface of the insulating material brick.

23. The semiconductor package assembly as claimed in claim 21, wherein the insulating material brick is free from any conductive structure coupled to the passive device.

24. The semiconductor package assembly as claimed in claim 19, further comprising a second semiconductor die directly above the first semiconductor die and beside the passive device.

25. The semiconductor package assembly as claimed in claim 24, wherein the second semiconductor die is disposed directly on the second substrate.

26. The semiconductor package assembly as claimed in claim 17, wherein the second semiconductor die is embedded in the insulating brick and separated from the passive device.

27. The semiconductor package assembly as claimed in claim 19, further comprising an additional semiconductor die directly on the insulating brick, without covering pads of the passive device.

28. The semiconductor package assembly as claimed in claim 27, wherein pads of the additional semiconductor die are not coplanar with the pads of the passive devices.

29. A semiconductor package assembly, comprising:
 a first substrate;
 a first semiconductor die disposed above the first substrate;
 a discrete passive device located directly on and fully overlapping the first semiconductor die, wherein an overlapping region between the passive device and the first semiconductor die is surrounded by a side surface of the first semiconductor die in a plan view; and
 an insulating material brick, wherein the passive device is embedded in the insulating material brick, and wherein a pad of the passive device connects directly to a pad of the first semiconductor die through a conductive wire.

30. The semiconductor package assembly as claimed in claim 29, wherein the passive device is separated from the first semiconductor die through a carrier.

31. The semiconductor package assembly as claimed in claim 29, wherein the carrier comprises a second substrate or an insulating material brick.

32. The semiconductor package assembly as claimed in claim 31, wherein the passive device is embedded in an insulating brick.

33. The semiconductor package assembly as claimed in claim 32, wherein the pads of the passive device are exposed from a first surface of the insulating material brick.

34. The semiconductor package assembly as claimed in claim 32, wherein the insulating material brick is free from any conductive structure coupled to the passive device.

35. The semiconductor package assembly as claimed in claim 31, further comprising a second semiconductor die directly above the first semiconductor die and beside the passive device.

36. The semiconductor package assembly as claimed in claim 35, wherein the second semiconductor die is embedded in the insulating brick and separated from the passive device.

37. The semiconductor package assembly as claimed in claim 31, further comprising an additional semiconductor die directly on the insulating brick, without covering pads of the passive device.

38. The semiconductor package assembly as claimed in claim 37, wherein pads of the additional semiconductor die are not coplanar with the pads of the passive devices.

* * * * *